United States Patent [19]

Ingraham et al.

[11] Patent Number: 5,709,336
[45] Date of Patent: Jan. 20, 1998

[54] METHOD OF FORMING A SOLDERLESS ELECTRICAL CONNECTION WITH A WIREBOND CHIP

[75] Inventors: Anthony Paul Ingraham; William Tze-You Chen, both of Endicott, N.Y.

[73] Assignee: International Business Machines Corporation, Armonk, N.Y.

[21] Appl. No.: 656,628

[22] Filed: May 31, 1996

[51] Int. Cl.⁶ ........................................... H05K 3/32
[52] U.S. Cl. .................... 228/116; 228/180.22; 228/191; 29/832
[58] Field of Search ............................. 228/180.22, 180.5, 228/191, 115, 116; 29/832, 874, 885

[56] References Cited

U.S. PATENT DOCUMENTS

| | | |
|---|---|---|
| 5,019,944 | 5/1991 | Ishii et al. .............................. 361/783 |
| 5,046,657 | 9/1991 | Iyer et al. . |
| 5,118,299 | 6/1992 | Burns et al. . |
| 5,137,461 | 8/1992 | Bindra et al. . |
| 5,163,834 | 11/1992 | Chapin et al. . |
| 5,185,073 | 2/1993 | Bindra et al. . |
| 5,190,463 | 3/1993 | Datta et al. . |
| 5,294,038 | 3/1994 | Nakano . |
| 5,298,685 | 3/1994 | Bindra et al. . |
| 5,313,097 | 5/1994 | Haj-Ali-Ahmadi et al. . |
| 5,384,090 | 1/1995 | Ogashiwa . |
| 5,528,159 | 6/1996 | Charlton et al. .......................... 324/758 |
| 5,531,022 | 7/1996 | Beaman et al. ............................ 29/850 |
| 5,604,445 | 2/1997 | Desai et al. .............................. 324/755 |

OTHER PUBLICATIONS

U.S. Patent Application Serial No. 08/360,919, filed Dec. 21, 1994 (IBM Docket EN9-94-088).
U.S. Patent Application Serial No. 08/360,920, filed Dec. 21, 1994 (IBM Docket EN9-94-087).

*Primary Examiner*—Samuel M. Heinrich
*Attorney, Agent, or Firm*—Robert A. McFall; Jenkens & Gilchrist; Michael E. Belk

[57] ABSTRACT

A dendrite surface is provided on each of the electrical contacts of a substrate, such as a test board, chip carrier, or printed wiring board. The electrical contacts on the substrate are arranged in a mirror image of the input/output pads on a wirebond chip from which the wire leads have been removed from, or not initially provided on, each of the input/output pads. The wirebond chip is aligned with the substrate, and the respective contact brought into electrical communication with each other. The wirebond chip may be removed after testing or other temporary attachment purpose, or permanently encapsulated with at least a portion of the substrate in a permanent assembly. The present invention permits wirebond chips to be selectively attached temporarily or permanently, i.e., have a pluggable capability, as well as the ability to allow a full array of I/O pad design.

7 Claims, 2 Drawing Sheets

METHOD OF FORMING A SOLDERLESS ELECTRICAL CONNECTION WITH A WIREBOND CHIP

BACKGROUND OF THE INVENTION

1. Technical Field

This invention relates generally to a method of providing an electrical connection with the contacts on a wirebond chip, and more particularly with such a method that may selectively provide either temporary or permanent electrical connection of a wirebond chip with another electrical complement.

2. Background Art

Wirebond chip bond assembly processes have been a mature technology for many years. The major advantage of this technology has been the relatively low cost of the wirebonding, using either wedge or ball bonding, which has provided a reliable, permanently assembled product. However, there are two major disadvantages that have heretofore been inherent in wirebond chips. The first major disadvantage is the inability to temporarily attach a wirebond chip to another component in such a manner that would allow removal of the chip without a major rework process. This disadvantage has limited the ability to test wirebond chips, and provide initial burn-in and early function testing of the fabricated chips. Furthermore, because wire leads extend outwardly from the contacts provided on the chip, it has been necessary heretofore to form the contacts around the periphery of the chip. This requirement has limited the placement of contacts to only the periphery of the chips, making it impossible to form input/output (I/O) contacts interiorly of the chip perimeter, i.e., a full array of contacts across a planar surface of wirebond chips.

The present invention is directed to overcoming the problems set forth above. It is desirable to have a method of providing electrical contact with wirebond chips which may selectively be either a temporary or permanent connection. It is also desirable to have such a method for forming electrical contacts with wirebond chips which would permit the chip to be designed with a full array of I/O contacts. Further, it is desirable to have such a method which provides the above advantages that is economical and can be carried out with existing technology and tooling.

SUMMARY OF THE INVENTION

In one aspect of the present invention, a method for forming a solderless electrical connection with a wirebond chip includes providing a wirebond chip having an active surface on which a plurality of electrical contacts are disposed in a predetermined pattern. An substrate is also provided, having a predefined electrical circuit disposed within the board and a plurality of electrical contacts disposed on a surface of the board and arranged in a pattern that is a matching mirror image of the predetermined pattern of the electrical contacts on the active surface of the wirebond chip. A plurality of electrically conductive dendrites are formed on each of the electrical contacts on the substrate. The wirebond chip is aligned with the substrate so that each of the electrical contacts on the wirebond chip is aligned with a respective dendrite surface electrical contact on the substrate. The electrical contacts of the wirebond chip are then brought into contact with the respectively aligned dendrite surfaced electrical contacts on the substrate and maintained in the respectively aligned contact with sufficient force to cause the dendrites on the contacts of the substrate to penetrate the surface of the contacts of the wirebond chip.

Other features of the method of forming a solderless electrical connection with a wirebond chip, in accordance with the present invention, includes alternatively removing the wire leads from a prefabricated wirebond chip or providing a wirebond chip wafer which has a plurality of electrical contact pads on at least one outer surface of the wafer. Other features of the method include alternatively testing the wirebond chip and then removing the wirebond chip from contact with the substrate, or permanently encapsulating the wirebond chip as an integral assembly with at least a portion of the substrate.

DETAILED DESCRIPTION OF A PRESENTLY PREFERRED EXEMPLARY EMBODIMENT

Conventional wire-bonded chips are typically formed by dicing a preformed wafer and forming a gold ball or wedge bond to a lead wire on each input/output (I/O) pad on the chip. The I/O pads are electronic interconnection sites provided on the surface of the chip. Because lead wires are bonded to each of the I/O pads, the pad density, i.e., the number of pads that can be located within a given area is restricted, and the pads must be arranged about the periphery of the chip to provide adequate clearance for the wire leads. Thus, it can be seen that these requirements prevent chip designers from using the full area of the chip for I/O pads, thereby placing an undesirable limitation on size and circuit density if a chip is designed for wire bond attachment with other circuits or components.

Figure 1:
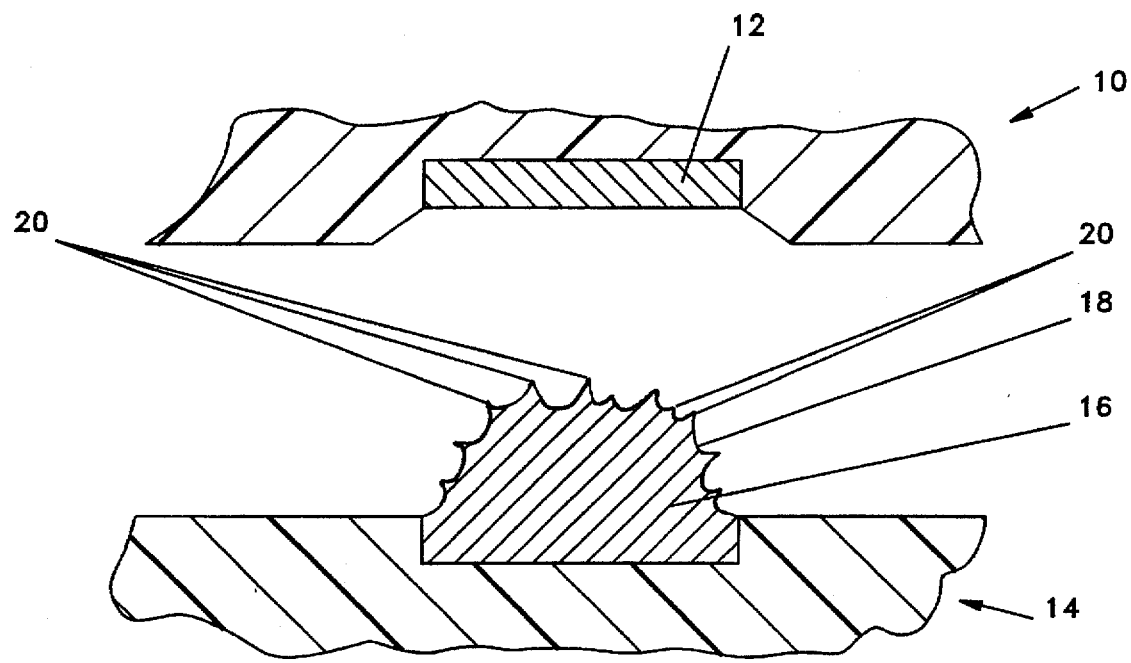
FIG. 1 is a cross-sectional view of an electrical contact of a wirebond chip in alignment with a dendrite-surfaced contact on a substrate.
Figure 2:
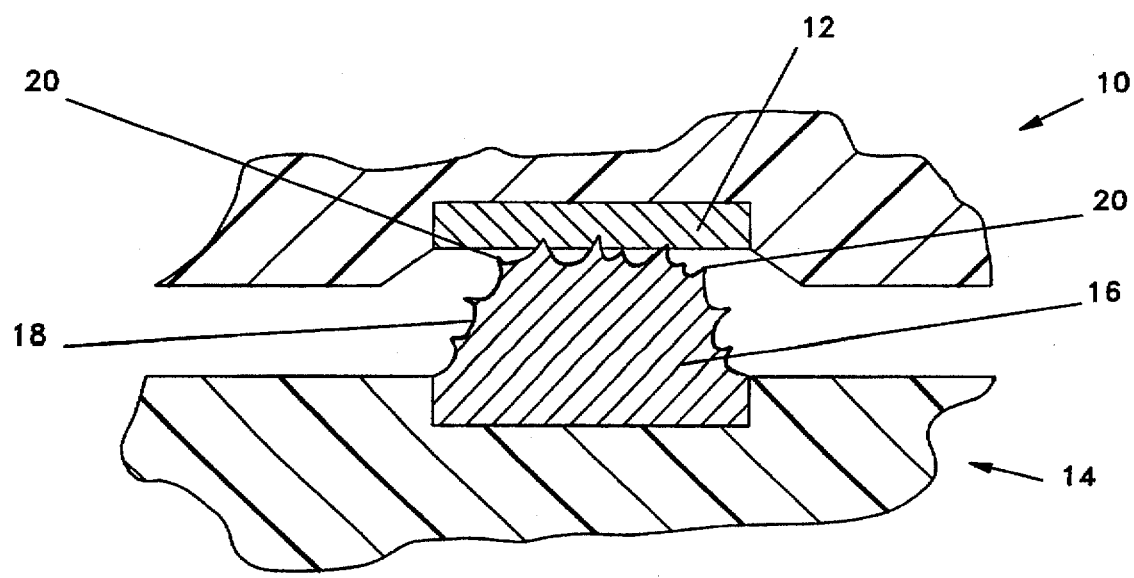
FIG. 2 is a cross-sectional view of an electrical contact of a wirebond chip in electrical contact with a dendrite-surfaced contact on a substrate.
Figure 3:
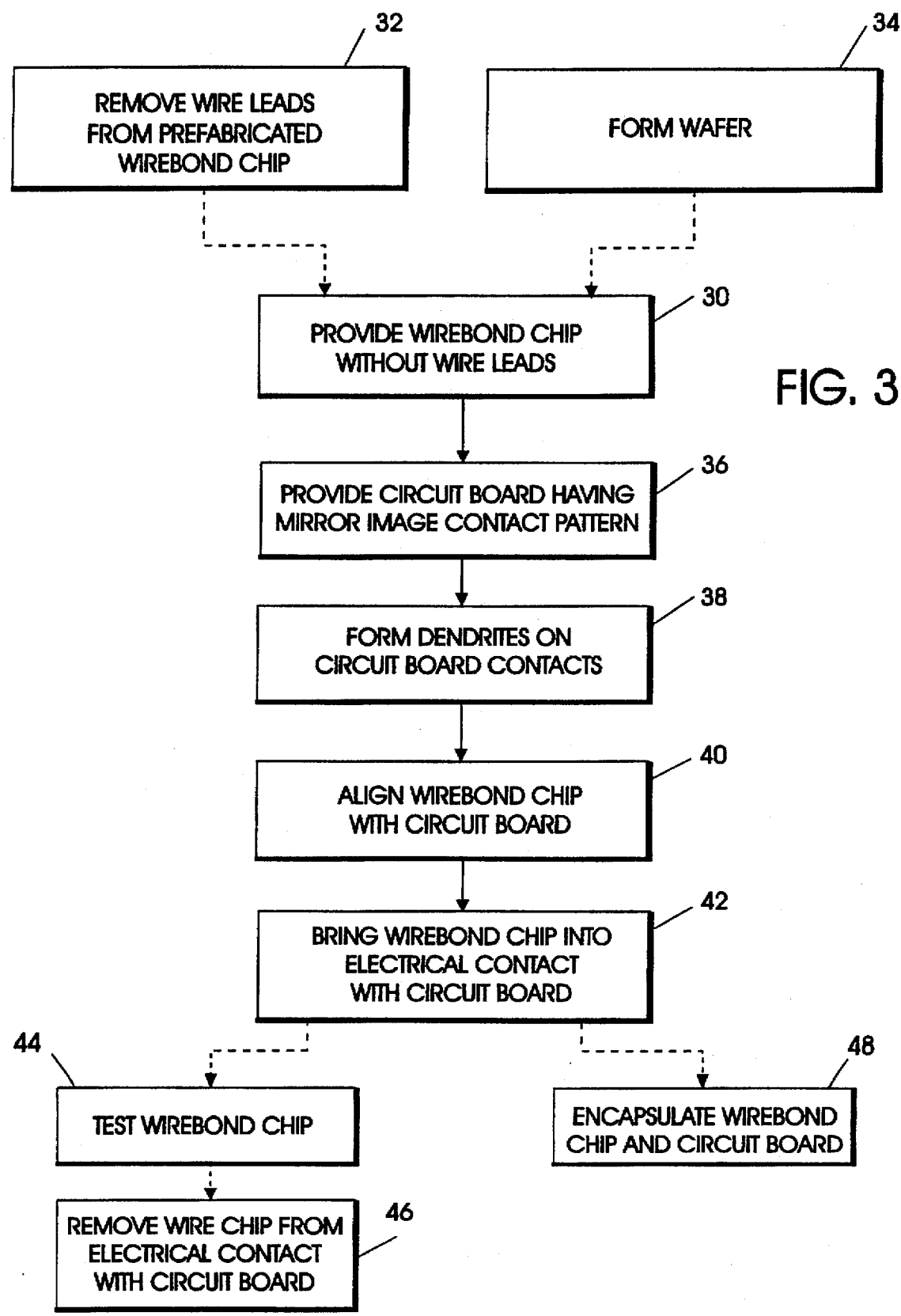
FIG. 3 is a flow diagram of a method, in accordance with the present invention, of forming a solderless electrical connection with a wirebond chip.

In the method for forming a solderless electrical connection with a wirebond chip, in accordance with the present invention, a wirebond chip 10, a portion of which is shown in FIGS. 1 and 2, may be initially provided, as indicated at block 30 in FIG. 3, by removing the wire leads from a previously formed wirebond chip as indicated at block 32. Removal of the wire leads may be advantageously carried out by existing tools, one example of which is IBM's Harmonicair™ wire bond removal tool which quickly removes all wires from a wire-bonded chip in a controlled and repetitive process. This process is both cost-effective and reliable. In the Harmonicair™ process, wires are removed from the device by pulsating jets of air. The harmonic pulsing of the air jets fatigues the wires until failure. Both aluminum and gold wires, whether wedge or ball bonded, can be easily removed using this process. The process leaves the wedge bond or a gold bump on the substrate with no damage to the pad or the substrate. Alternatively, using other existing tools, the lead wires may be manually severed by cutting the wire as close as possible to the chip by either flame cutting or manual pull.

Alternatively, in an important advantage of another aspect of the present invention, the chips may be processed in wafer form with a plurality of electrical contact pads on at least one outer surface of the wafer, either with or without the gold bumping process, and then after dicing, are ready for use in accordance with the present invention, as indicated at block 34.

An input/output (I/O) pad 12 is typically formed so that is is slightly recessed below the active surface of the chip 10, as shown in FIGS. 1 and 2. The I/O pads 12 are in electrical communication with one or more element of the circuit formed within the chip 10. Typically the I/O pads 12 are formed of an electrically conductive material such as aluminum.

An electronic substrate member 14, such as a printed wiring board, a test board, or a chip carrier such as a flex circuit single or multiple chip module having the ability to be plugged into or connected to another component, is provided as indicated at block 36 in FIG. 3. The substrate 14 has a plurality of electrical contacts 16 which are disposed on a wiring surface 18 and are in electrical communication with respective components of a predefined electrical circuit disposed within the board 14. The electrical contacts 16 of the substrate are arranged in a matching mirror image of the predetermined patten in which the electrical contacts, i.e., the I/O pads 12, are arranged on the wirebond chip 10.

Importantly, in carrying out the method embodying the present invention for forming the solderless electrical connection with a wirebond chip, a plurality of electrically conductive dendrites 20 are formed on each of the electrical contacts 16 of the substrate 14. Advantageously, the dendrites 20 are formed by pulse electroplating palladium onto the electrical contacts 16 by the DendriPlate™ electroplating process, developed by International Business Machines. The dendrite structure, and the method for forming the dendrites, are described respectively in U.S. Pat. Nos. 5,137,461 issued Aug. 11, 1992 and 5,185,073 issued Feb. 9, 1993 to Bindra, et al, and assigned to the assignee of the present invention. These patents are incorporated herein by reference for all purposes. The dendrite structure formed by the DendriPlate™ process consists of a matrix of multile needle-like or nodular protrusions per square millimeter extending from each of the electrical contacts 16. This structure allows for a multitude of penetrations through the metal oxide layer of the mating I/O pad 12 on the wirebond chip 10. For this reason, it is not necessary to form raised bumps, in the form of wedges or balls, of precious metals such as gold or silver. The dendrites 20 are capable of penetrating the oxide layer on the flush aluminum I/O pad 12 on the wirebond chip 10 as shown in FIG. 2 of the drawings. However, if wedges, balls or other raised contact bumps are present, it is not necessary to remove the raised contacts. The dendrites 20 are equally capable of penetrating the raised contacts as readily as flush pads.

After providing a wirebond chip 10 without wire leads, as indicated at block 30, and providing an substrate 14 having a mirror image contact pattern as indicated at block 36 and providing dendrites on the substrate contacts, as indicated at block 38, the wirebond chip 10 is aligned with the substrate 14 as indicated at Block 40 in FIG. 1 of the drawings. The wirebond chip 10 is aligned with the substrate 14 so that each of the electrical contacts 12 is aligned with a respective dendrite-surfaced electric contact 16 on the substrate 14.

After aligning the wirebond chip 10 with the substrate 14, the electrical contacts 12, 16 of the two components are brought together as indicated at block 42 with sufficient force to provide electrical penetration of the dendrites 26 into the mating electrical contact 12 on the wirebond chip 10, and establish electrical contact between the two elements 16, 12.

After bringing the electrical contacts, or I/O pads, 12 on the wirebond chip 10 into electrical contact with the contacts 16 on the substrate 14, the established electrical contact is maintained for a period of time, depending upon a selected function or purpose. For example, the established electrical contact may be maintained for only a short period of time for test purposes, as indicated at box 44, after which the wirebond chip 10 may be removed from electrical contact with the substrate 10 as indicated at block 46. This temporary connection, which was unattainable heretofore with wirebond chips, is useful not only for performance testing, but also for burn-in of a new chip, early functional testing, and other tests that may be conducted for quality assurance purposes.

Alternatively, the wirebond chip 10 may be permanently encapsulated with at least a portion of the substrate 14 by a dielectric material such as epoxy, as indicated at block 48. Thus, in accordance with the method embodying the present invention, a wirebond chip 10 may be permanently joined with other components without the requirement of having individual wires emanating from each of the I/O pads 12. This important feature enables large wirebond chips to be designed so that full use may be made of the surface of the chip, i.e., a full array contact pattern provided on the chip.

The wirebond chip 10 may be supported by a lead frame wherein the electrical contacts 12 are disposed in a predetermined pattern on an outer surface of the lead frame. In such arrangements, the integrated wirebond chip and lead frame are processed as a single unit, as described above with reference to a wirebond chip.

Although the present invention is described in terms of a preferred exemplary embodiment, those skilled in the art will recognize that changes in the method of removing the wire leads from the wirebond chip, and in providing a mating component other than a substrate, containing a mirror image of the electrical contact pattern on the wirebond chip, may be made without departing from the spirit of the invention. Such changes are intended to fall within the scope of the following claims. Other aspects, features and advantages of the present invention can be obtained from a study of this disclosure and drawings, along with the appended claims.

What is claimed is:

1. A method for forming a solderless electrical connection with a wirebond chip comprising:

providing a wirebond chip having an active surface and a plurality of electrical contacts disposed in predetermined pattern on said active surface;

providing an substrate having an wiring surface, a predefined electrical circuit disposed within said board, and a plurality of electrical contact disposed on surface and arranged in a pattern that is a matching mirror image of the predetermined pattern of electrical contacts disposed on the active surface of the wirebond chip;

forming a plurality of electrically conductive dendrites, on each of the electrical contacts on the substrate.

aligning the wirebond chip with the substrate so that each of the electrical contacts on the wirebond chip is aligned with a respective dendrite-surfaced electrical contact on the substrate;

bringing the electrical contacts of the wirebond chip into contact with the respectively aligned dendrite-surfaced electrical contacts on the substrate; and maintaining the electrical contacts of the wirebond chip in contact with the respectively aligned dendrite-surfaced electrical contacts on the substrate with sufficient force to cause the dendrites on the surface of the electrical contacts of the substrate to penetrate the surface of the respectively aligned electrical contacts of the wirebond chip.

2. A method of forming a solderless electrical connection with a wirebond chip, as set forth in claim 1, wherein said wirebond chip is supported by a lead frame, and said plurality of electrical contacts disposed in a predetermined pattern on the active surface of the wirebond chip are disposed on an outer surface of the lead frame.

3. A method of forming a solderless electrical connection with a wirebond chip, as set forth in claim 1, wherein said providing a wirebond chip includes removing the pre-attached wire leads from a previously formed wirebond chip having a wire lead attached to each of said electrical contacts disposed in a predetermined pattern on the active surface of the wirebond chip.

4. A method of forming a solderless electrical connection with a wirebond chip, as set forth in claim 1, wherein said wirebond chip is a wafer having a plurality of defined contact pads disposed in said predetermined pattern on the outer surface of said wafer.

5. A method of forming a solderless electrical connection with a wirebond chip, as set forth in claim 4, wherein said predetermined pattern of the electrical contacts disposed on the active surface of the wirebond chip is distributed in a full array completely over a predetermined planar surface of the wirebond chip.

6. A method of forming a solderless electrical connection with a wirebond chip, as set forth in claim 1, wherein said maintaining the electrical contacts of the wirebond chip in electrical contact with the respectively aligned dendrite-surfaced electrical contacts of the substrate include encapsulating said wirebond chip and at least a portion of said substrate within a substantially rigid dielectric material.

7. A method of forming a solderless electrical connection with a wirebond chip, as set forth in claim 1, wherein said method includes testing the wirebond chip and then subsequent to said test, removing the electrical contacts of the wirebond chip from electrical contact with the dendrite-surfaced electrical contacts of the substrate.

\* \* \* \* \*